United States Patent [19]
Manning et al.

[11] Patent Number: 6,049,093
[45] Date of Patent: *Apr. 11, 2000

[54] PLANAR THIN FILM TRANSISTOR FORMATION

[75] Inventors: H. Montgomery Manning, Kuna; Charles H. Dennison, Meridian, both of Id.

[73] Assignee: Micron Technology, Inc., Boise, Id.

[*] Notice: This patent is subject to a terminal disclaimer.

[21] Appl. No.: 09/187,298

[22] Filed: Nov. 5, 1998

Related U.S. Application Data

[63] Continuation of application No. 08/858,863, May 19, 1997, Pat. No. 5,844,254, which is a continuation of application No. 08/376,866, Jan. 23, 1995, Pat. No. 5,691,547, which is a division of application No. 08/082,401, Jun. 23, 1993, Pat. No. 5,411,909, which is a continuation-in-part of application No. 08/021,274, Feb. 22, 1993, Pat. No. 5,422,499.

[51] Int. Cl.$^7$ .............................. H01L 29/76; H01L 21/70
[52] U.S. Cl. .......................... 257/67; 257/393; 257/752; 438/152; 438/158; 438/692
[58] Field of Search ...................... 438/152, 158, 438/692; 257/66, 67, 393, 640, 641, 650, 752, 903

[56] References Cited

U.S. PATENT DOCUMENTS

| | | | |
|---|---|---|---|
| 4,603,468 | 8/1986 | Lam | 29/571 |
| 4,814,841 | 3/1989 | Masuoka et al. | 357/23.7 |
| 5,034,797 | 7/1991 | Yamanaka et al. | 357/42 |
| 5,064,683 | 11/1991 | Poon et al. | 427/39 |
| 5,240,871 | 8/1993 | Doan et al. | 437/47 |
| 5,262,655 | 11/1993 | Ashida | 257/66 |
| 5,318,920 | 6/1994 | Hayashide | 437/47 |
| 5,320,975 | 6/1994 | Cederbaum et al. | 257/69 |
| 5,334,861 | 8/1994 | Pfiester et al. | 257/67 |
| 5,411,909 | 5/1995 | Manning et al. | 438/152 |
| 5,459,688 | 10/1995 | Pfiester et al. | . |
| 5,468,662 | 11/1995 | Havemann et al. | . |
| 5,691,547 | 11/1997 | Manning et al. | . |

FOREIGN PATENT DOCUMENTS

| | | | |
|---|---|---|---|
| 4312468 | 10/1993 | Germany | 257/68 |
| 62-154770 | 7/1987 | Japan | 257/74 |

OTHER PUBLICATIONS

Yuzuriha, K., et. al., "A Large Cell–Ratio And Low Node Leak 16M–bit SRAM Cell Using Ring–Gate Transistors", IEDM 91–485 (1991).

Itabashi, et. al., A Split Wordline Cell For 16Mb SRAM Using Polysilicon Sidewall Contacts, IEDM 91–477 (1991).

Hayden, J., et. al., "A High Performance Quadruple Well, Quadruple Poly BiCMOS Process For Fast 16Mb SRAMs", IEDM 92–819 (1992).

*Primary Examiner*—Minh Loan Tran
*Attorney, Agent, or Firm*—Wells, St. John, Roberts, Gregory & Matkin P.S.

[57] ABSTRACT

The disclosure includes preferred semiconductor transistor devices utilizing thin film transistors, as well as preferred methods of forming such devices. Specifically, a bottom thin film transistor gate is formed having a top surface. An insulating filler is provided adjacent the thin film transistor gate to an elevation at least as high as the thin film transistor gate top surface, and subsequently levelled to provide generally planar insulating surfaces adjacent the thin film transistor gate. The planar insulating surfaces are substantially coplanar with the thin film transistor gate top surface. A planar semiconductor thin film is then formed over the thin film transistor gate and over the adjacent planar insulating surfaces. The thin film is doped to form source and drain regions of a thin film transistor which is bottom gated by the thin film transistor gate.

12 Claims, 7 Drawing Sheets

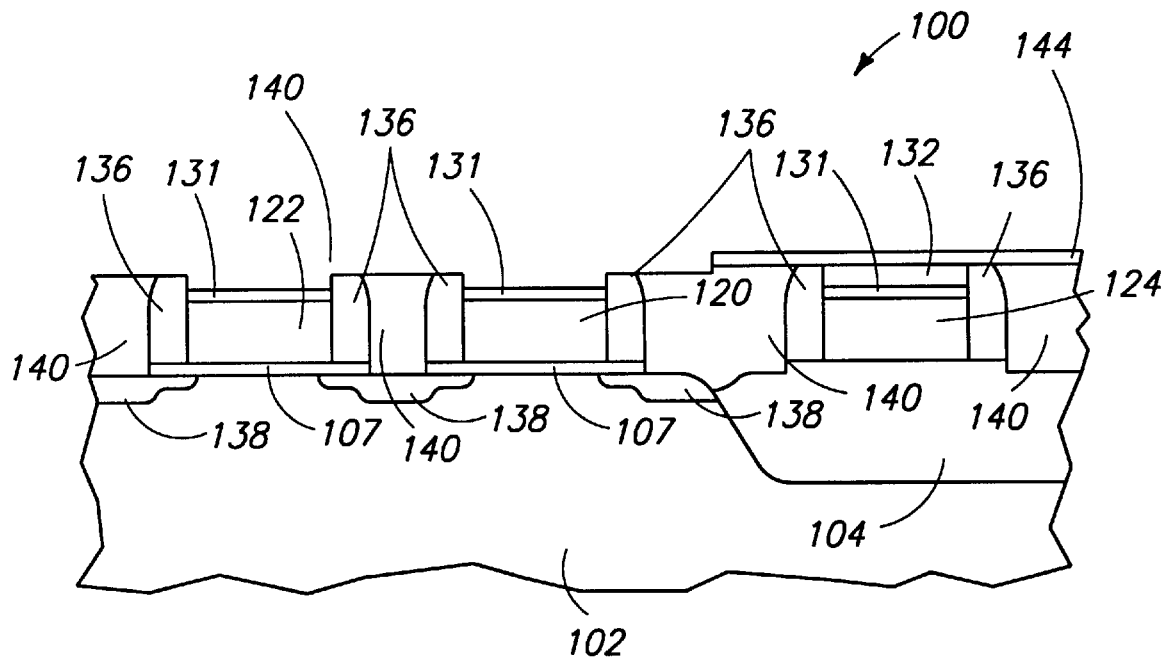
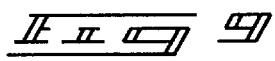
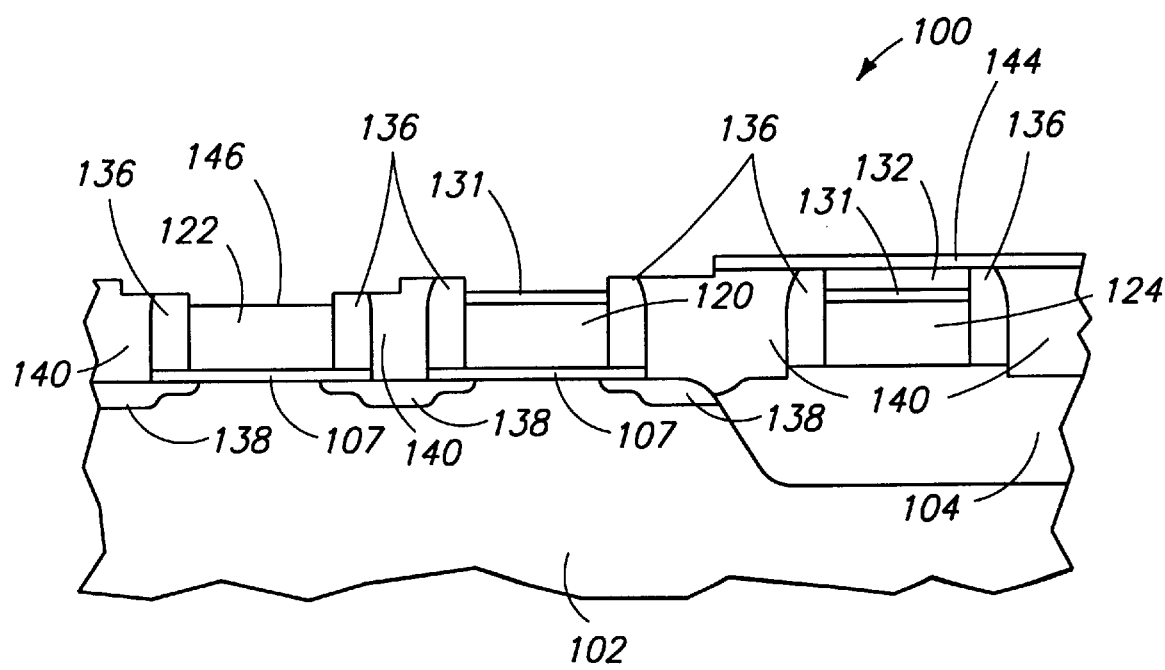

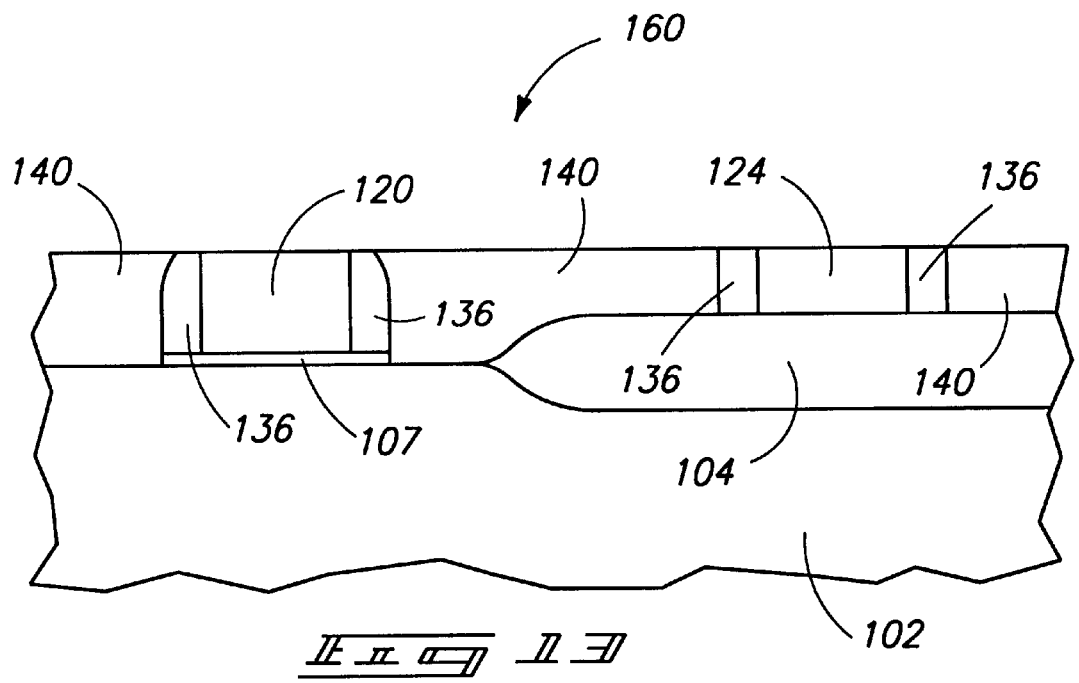
_Fig. 13_
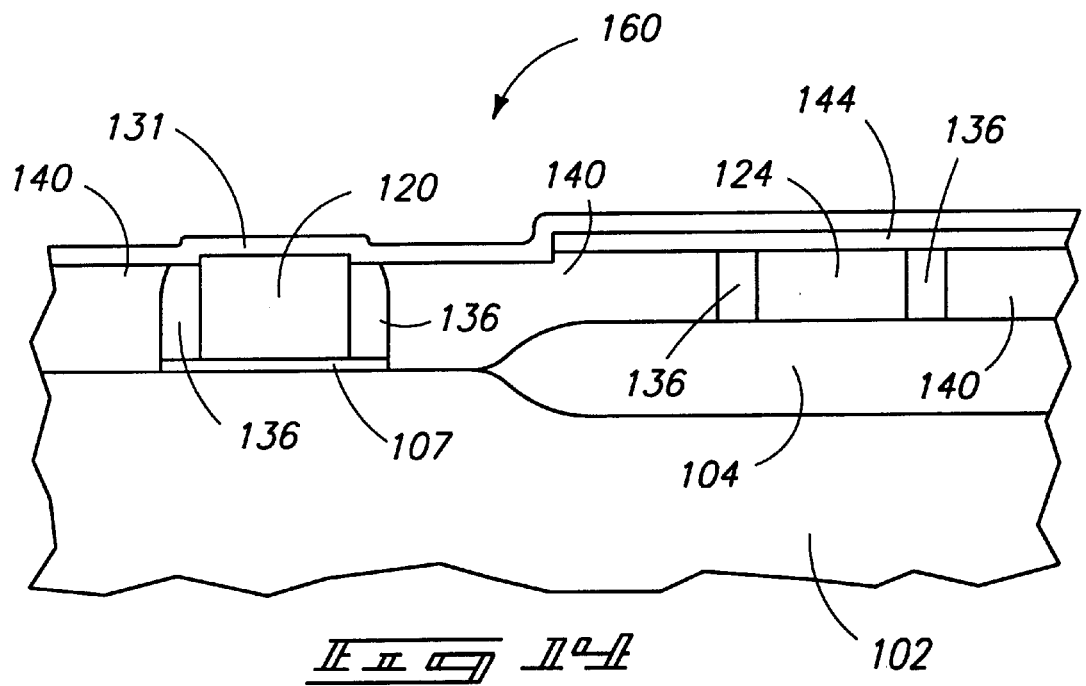
_Fig. 14_

PLANAR THIN FILM TRANSISTOR FORMATION

RELATED PATENT DATA

This patent resulted from a continuation application of U.S. patent application Ser. No. 08/858,863, which is now U.S. Pat. No. 5,844,254 which was filed on May 19, 1997, which was a continuation application of U.S. patent application Ser. No. 08/376,866, filed Jan. 23, 1995, which is now U.S. Pat. No. 5,691,547, which was a divisional application of U.S. patent application Ser. No. 08/082,401, filed Jun. 23, 1993, which is now U.S. Pat. No. 5,411,909, which is in turn a continuation-in-part application of U.S. patent application Ser. No. 08/021,274, filed Feb. 22, 1993, which is now U.S. Pat. No. 5,422,499.

TECHNICAL FIELD

This invention relates to improved formation of thin film transistor devices.

BACKGROUND OF THE INVENTION

Certain field effect transistor devices known as thin film transistors are useful in the fabrication of various circuits including bistable flip-flops and static memory cells utilizing such flip-flops. FIG. 1 shows a typical static random access memory cell (referred to herein as an SRAM cell), generally designated by the reference numeral 10.

Static memory cell 10 generally comprises first and second inverters 12 and 14 which are cross-coupled to form a bistable flip-flop. Inverters 12 and 14 are formed by n-channel driver or pull-down transistors 16 and 17, and p-channel load transistors 18 and 19. Driver transistors 16 and 17 are typically metal oxide silicon field effect transistors (MOSFETs) formed in an underlying silicon semiconductor substrate. This type of transistor is sometimes referred to as a "bulk" device because its active regions are formed in the bulk substrate. P-channel transistors 18 and 19 are typically thin film transistors formed above the driver transistors.

The source regions of driver transistors 16 and 17 are tied to a low reference or circuit supply voltage, labelled $V_{ss}$ and typically referred to as "ground." Load transistors 18 and 19 are connected in series between a high reference or circuit supply voltage, labelled $V_{cc}$, and the drains of the corresponding driver transistors 16 and 17. The gates of load transistors 18 and 19 are connected to the gates of the corresponding driver transistors 16 and 17. The physical construction of many semiconductor memory cells allow a common transistor gate conductor to be used to gate corresponding driver and load transistors, as will be explained more fully below.

Inverter 12 has an inverter output 20 formed by the drain of driver transistor 16. Similarly, inverter 14 has an inverter output 22 formed by the drain of driver transistor 17. Inverter 12 has an inverter input 24 formed by the gate of driver transistor 16. Inverter 14 has an inverter input 26 formed by the gate of driver transistor 17.

The inputs and outputs of inverters 12 and 14 are cross-coupled to form a flip-flop having a pair of complementary two-state outputs. Specifically, inverter output 20 is cross-coupled to inverter input 26, and inverter output 22 is cross-coupled to inverter input 24. In this configuration, inverter outputs 20 and 22 form the complementary two-state outputs of the flip-flop.

A memory flip-flop such as that described typically forms one memory element of an integrated array of static memory elements. A plurality of access transistors, such as access transistors 30 and 32, are used to selectively address and access individual memory elements within the array. Access transistor 30 is an n-channel MOSFET having one active terminal connected to cross-coupled inverter output 20. Access transistor 32 is an n-channel MOSFET having one active terminal connected to cross-coupled inverter output 22. A plurality of complementary or "split" column line pairs, such as the single pair of column lines 34 and 36 shown, are connected to the remaining active terminals of access transistors 30 and 32, respectively. A row line 38 is connected to the gates of access transistors 30 and 32.

Reading static memory cell 10 requires activating row line 38 to connect inverter outputs 20 and 22 to column lines 34 and 36. Writing to static memory cell 10 requires first placing selected complementary logic voltages on column lines 34 and 36, and then activating row line 38 to connect those logic voltages to inverter outputs 20 and 22. This forces the outputs to the selected logic voltages, which will be maintained as long as power is supplied to the memory cell, or until the memory cell is reprogrammed.

FIG. 2 shows the physical structure of one prior art SRAM cell 40 utilizing thin film transistors. SRAM cell 40 includes a p-type silicon semiconductor substrate 42 and an oxide field isolation region 44. SRAM cell 40 also includes adjacent first and second transistor gate conductors 46 and 48. Each transistor gate conductor 46 and 48 performs several functions. For instance, transistor gate conductor 46 serves as a gate for an overlying thin film transistor which corresponds to load transistor 18 of FIG. 1, and also as a gate for an underlying bulk substrate transistor which corresponds to driver transistor 16 of FIG. 1. Transistor gate conductor 46 also serves as an interconnecting conductor between the gates of load transistor 18 and driver transistor 16. Similarly, transistor gate conductor 48 serves as a gate for an overlying thin film transistor which corresponds to load transistor 19 of FIG. 1, and also as a gate for an underlying bulk substrate transistor which corresponds to driver transistor 17 of FIG. 1. Transistor gate conductor 48 also serves as an interconnecting conductor between the gates of load transistor 19 and driver transistor 17.

As shown by FIG. 2, a discrete conductor 50 is formed adjacent first transistor gate conductor 46. A similar discrete conductor (not shown) is also formed adjacent second transistor gate conductor 48. These conductors correspond to row or word line 38 of FIG. 1. Access transistor 30 is formed beneath discrete conductor 50 in portions of the semiconductor substrate which are not shown by FIG. 2. FIG. 2 does show underlying active areas associated with driver transistors 16 and 17, designated by the reference numeral 52.

Each of gate conductors 46 and 48 is spaced from the underlying substrate by a gate oxide layer 54. Insulating sidewall spacers 56 are formed adjacent the sidewalls of gate conductors 46 and 48. Similar insulating spacers 58 are formed adjacent the sidewalls of discrete conductor 50. A thin insulating oxide layer 60 overlies the entire structure, forming a thin film transistor gate oxide above transistor gate conductors 46 and 48. Oxide layer 60 follows the contours of the gate conductors and the discrete conductor, resulting in deep valleys between conductors.

Thin film regions are provided over oxide layer 60 to form the channel, source, and drain regions of thin film transistors corresponding to load transistors 18 and 19 of FIG. 1. A thin film 62, shown in FIG. 2, forms load transistor 18 as shown in FIG. 1. Thin film 62 is formed over the gate oxide covering first gate conductor 46. It extends laterally over discrete conductor 50 and is insulated from discrete conductor 50 by oxide layer 60. Thin film 62 also extends laterally over and into electrical contact with second gate conductor 48. A as portion of gate oxide layer 60 over second gate conductor 48 is removed and replaced with a thin conductive film 64 to allow this electrical contact. The right-hand side of thin film 62 is doped to form the source of load transistor 18, which is typically connected to $V_{cc}$ as described above with reference to FIG. 1. The left-hand side of thin film 62 is doped to form the drain of load transistor 18, and is connected to the gates of transistors 17 and 19 through conductive region 64.

The construction described above provides notable advantages over older, non-thin-film technology. However, increasing requirements for higher memory cell densities have begun to reveal shortcomings in existing fabrication methods. For instance, as memory and transistor densities increase, higher resolution is required of lithography equipment. This is typically achieved by increasing the numerical aperture of such equipment. However, increased aperture results in a correspondingly reduced depth of focus. The structure described above has what can be termed as severe topology, containing an overall variation in surface elevation or depth of over 2,500 Angstroms. This surface elevation variation imposes a limit on the degree of workable increase in the numerical aperture of lithography equipment, therefore limiting the achievable density of thin film transistors and memory circuits utilizing such transistors.

The severe topology of prior art SRAM constructions causes other practical difficulties in semiconductor processing. These problems result from the surface elevation or height steps in the various material layers associated with thin film formation. For instance, severe elevation steps often impose a requirement for an anti-reflective coating beneath applied photoresist. Application and presence of anti-reflective coatings creates numerous difficulties in subsequent processing relating primarily to the removal of the coatings. One such difficulty arises because of the unavailability of anti-reflective coating etching processes which are selective to either polysilicon or oxide. Thus, removing anti-reflective coatings from vertical surfaces can result in over-etching of thin underlying layers of polysilicon or oxide layers on horizontal surfaces.

Patterning of the polysilicon thin film is also difficult when the thin film is applied over severe topologies and elevation steps. This difficulty is due primarily to the anisotropic nature of preferred etching processes. During thin film etching, underlying thin layers of oxide are typically utilized as etch stops. However, anisotropically removing thin polysilicon layers lying along steep vertical surfaces requires extended periods of etching. Such extended etching can damage the thin oxide layers over horizontal surfaces.

The invention described below reduces or eliminates many of the difficulties discussed above.

BRIEF DESCRIPTION OF THE DRAWINGS

Preferred embodiments of the invention are described below with reference to the following accompanying drawings:

FIG. 9 is a diagrammatic section of a portion of a preferred static memory cell in accordance with the invention, shown at a processing step subsequent to that illustrated by FIG. 8;

FIG. 10 is a diagrammatic section of a portion of a preferred static memory cell in accordance with the invention, shown at a processing step subsequent to that illustrated by FIG. 9;

FIG. 13 is a diagrammatic section of a portion of an alternative embodiment of a static memory cell in accordance with the invention, shown at a processing step subsequent to that illustrated by FIG. 12;

FIG. 14 is a diagrammatic section of a portion of an alternative embodiment of a static memory cell in accordance with the invention, shown at a processing step subsequent to that illustrated by FIG. 13.

DETAILED DESCRIPTION OF THE PREFERRED EMBODIMENTS

Figure 1:
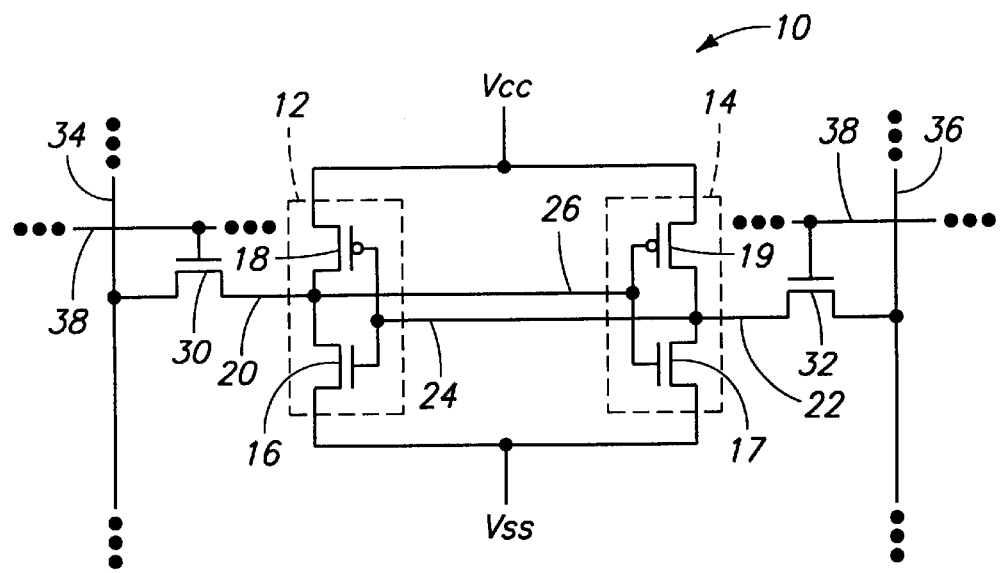
FIG. 1 is a schematic diagram of a prior art static memory cell.
Figure 2:
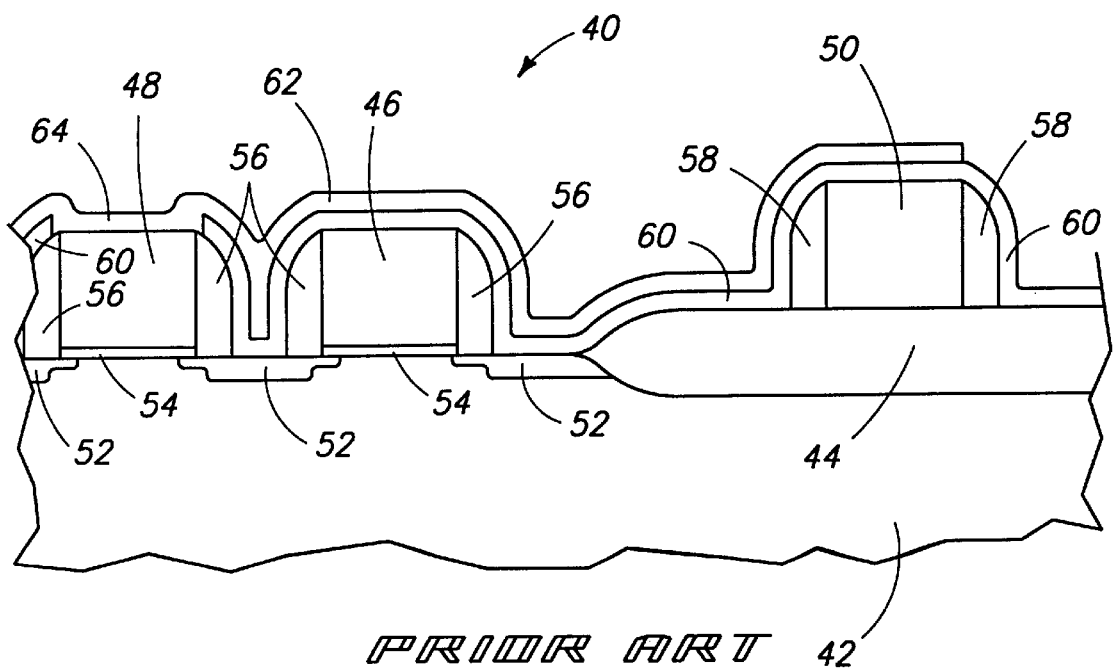
FIG. 2 is a diagrammatic section of a portion of a prior art integrated circuit static memory cell.

This disclosure of the invention is submitted in furtherance of the constitutional purposes of the U.S. Patent Laws "to promote the progress of science and useful arts." U.S. Constitution, Article 1, Section 8.

The invention includes methods of forming thin film transistors in a semiconductor transistor device. A preferred method comprises:

forming a bottom thin film transistor gate over a semiconductor substrate, the bottom thin film transistor gate having a top surface;

providing an insulating filler over the semiconductor substrate adjacent the thin film transistor gate to an elevation at least as high as the thin film transistor gate top surface;

leveling the insulating filler to provide generally planar insulating surfaces adjacent the thin film transistor gate which are substantially coplanar with the thin film transistor gate top surface;

forming a planar semiconductor thin film over the thin film transistor gate and over the adjacent planar insulating surfaces; and doping the thin film to form source and drain regions of a thin film transistor which is bottom gated by the thin film transistor gate.

The invention further includes methods of forming static random access memory cells utilizing thin film transistors. One such method comprises:

forming first and second adjacent transistor gate conductors over a semiconductor substrate, the transistor gate conductors having substantially coplanar top surfaces;

forming a discrete conductor adjacent one of the transistor gate conductors, the discrete conductor having a top surface which is substantially coplanar with the transistor gate conductor top surfaces;

implanting the semiconductor substrate to create first and second driver transistors in the semiconductor substrate, the first and second driver transistors being gated by the first and second transistor gate is conductors, respectively;

providing an insulating filler over the semiconductor substrate adjacent the transistor gate conductors and the discrete conductor to an elevation at least as high as the top surfaces of the transistor gate conductors and the discrete conductor;

leveling the insulating filler to provide generally planar insulating surfaces which are substantially coplanar with the top surfaces of the transistor gate conductors and the discrete conductor;

forming a first planar semiconductor thin film over the first transistor gate conductor, over the adjacent planar insulating surfaces, at least partially over the coplanar discrete conductor, and at least partially over the second transistor gate conductor; and doping the first planar semiconductor thin film to form source and drain regions of a first thin film load transistor which is bottom gated by the first transistor gate conductor.

The invention also includes thin film transistors fabricated by means of the methodical steps described herein and by other means. A preferred thin film transistor in accordance with the invention comprises:

a bottom thin film transistor gate having a top surface;

an insulating filler provided over the semiconductor substrate adjacent the thin film transistor gate, the insulating filler having generally planar upper insulating surfaces which are substantially coplanar with the thin film transistor gate top surface; and a planar semiconductor thin film over the thin film transistor gate and over the adjacent planar insulating surfaces, the planar semiconductor thin film being doped to form source and drain regions of a thin film transistor which is bottom gated by the thin film transistor gate.

A preferred static random access memory cell in accordance with the invention comprises:

first and second adjacent transistor gate conductors over a semiconductor substrate, the transistor gate conductors having substantially coplanar top surfaces;

a discrete conductor adjacent one of the transistor gate conductors, the discrete conductor having a top surface which is substantially coplanar with the transistor gate conductor top surfaces;

transistor active areas implanted in the semiconductor substrate to create first and second driver transistors, the first and second driver transistors being top gated by the first and second transistor gate conductors, respectively;

an insulating filler over the semiconductor substrate adjacent the transistor gate conductors and the discrete conductor, the insulating filler having generally planar upper insulating surfaces which are substantially coplanar with the top surfaces of the transistor gate conductors and the discrete conductor; and a first planar semiconductor thin film over the first transistor gate conductor, over the adjacent planar insulating surfaces, at least partially over the discrete conductor, and at least partially over the second transistor gate conductor, the first planar semiconductor thin film being doped to form source and drain regions of a first thin film load transistor which is bottom gated by the first transistor gate conductor.

FIGS. 3–11 show cross-sectional views of a preferred semiconductor transistor device 100 in accordance with the invention, at various progressive stages of fabrication. Transistor device 100 forms a static random access memory cell which in turn forms part of an integrated circuit including an array of such memory cells. The preferred methods and structures result in electrical characteristics which are schematically and functionally similar to the circuits described with reference to FIG. 1. Reference to FIG. 1 will thus be made throughout the following discussion.

Figure 3:
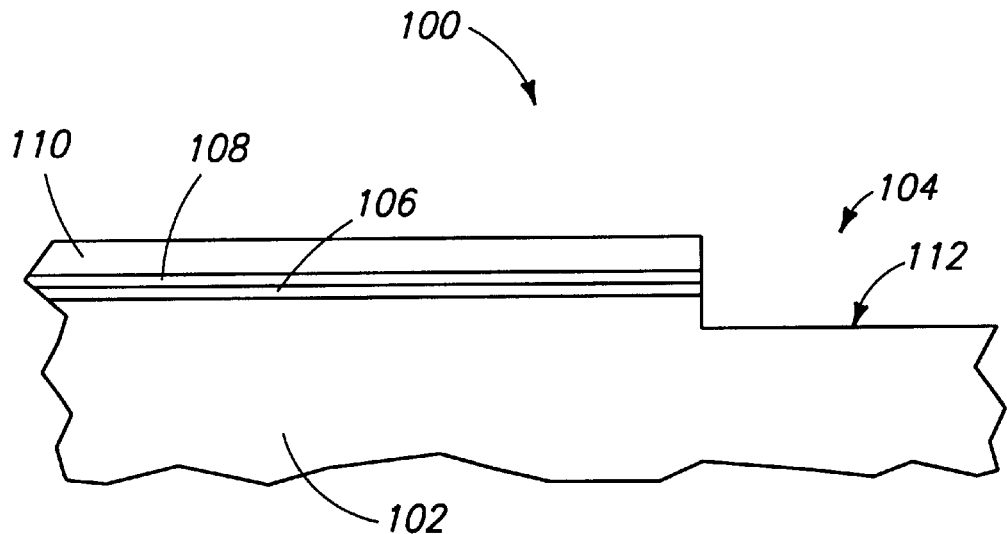
FIG. 3 is a diagrammatic section of a portion of a preferred static memory cell in accordance with the invention, shown at an initial processing step.
Figure 4:
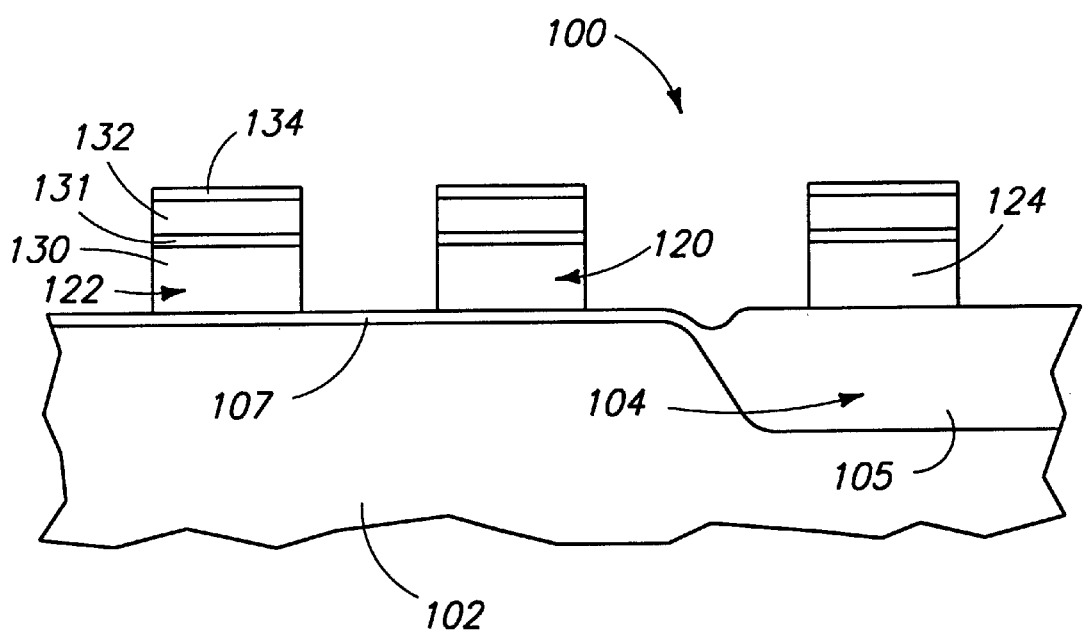
FIG. 4 is a diagrammatic section of a portion of a preferred static memory cell in accordance with the invention, shown at a processing step subsequent to that illustrated by FIG. 3.

Transistor device 100 is fabricated on a p-type semiconductor substrate 102. The p-type region shown can be formed by an implanted well if desired. Initial steps include forming a fully recessed field isolation region 104 on semiconductor substrate 102 as shown by FIGS. 3 and 4. In the preferred embodiment shown, field isolation region 104 is fully recessed within substrate 102 so that substrate 102 and field isolation region 104 have top surfaces which are substantially coplanar.

Recessed field isolation region 104 is preferably formed by a poly-buffered LOCOS isolation technique (LOCal Oxidation of Silicon). LOCOS isolation involves the formation of a recessed or semi-recessed oxide in the non-active (or field) areas of the bulk substrate. Such oxide is typically thermally grown by means of wet oxidation of the bulk silicon substrate at temperatures of around 1000° C. for two to four hours. The oxide grows over silicon areas which are not covered by masking material. A nitride such as $Si_3N_4$ is a typical masking material used to cover areas where field oxide is not desired. Standard LOCOS and trench isolation techniques can also be used to form field isolation region 104.

The preferred methods of forming field isolation region 104 in accordance with this invention include initially providing a pad oxide layer 106 directly over the upper surface of substrate 102. Pad oxide layer 106 is formed by deposition or more preferably by exposure to oxidizing conditions. A typical thickness for layer 106 is 200 Angstroms.

A layer of polysilicon 108 is provided over pad oxide layer 106 to a thickness of approximately 500 Angstroms. A nitride layer 110 is subsequently provided over polysilicon layer 108 to act as a mask during subsequent oxidation steps. Nitride layer 110 is typically applied to a thickness of approximately 2000 Angstroms. A photoresist mask (not shown) is patterned over nitride layer 110 and the various layers are etched, using an appropriate sequence of etching chemicals, to produce a shallow isolation trench 112. Trench 112 is preferably about 1000 Angstroms below the upper surface of substrate 102. The photoresist layer mentioned above is then stripped.

The semiconductor substrate is subjected to oxidation conditions such as described above to grow field oxide 105 within trench 112. The surface is then etched to remove nitride layer 110, polysilicon layer 108, and pad oxide layer 106. Conventional processing steps, such as threshold implanting, are conducted as needed to prepare the underlying substrate for provision of transistor active areas.

A gate oxide layer 107 is subsequently provided over substrate 102. The processes described result in field isolation region 104 having a top surface which is substantially coplanar with the top surface of substrate 102. More specifically, the top surface of field isolation region 104 is approximately level with the top surface of gate oxide layer 107, providing an essentially coplanar surface upon which transistor gate conductors and other conducting elements can be constructed.

The methods of the invention further comprise forming first and second adjacent transistor gates or transistor gate conductors 120 and 122 over the semiconductor substrate 102. First and second conductors 120 and 122 form the gates of subsequently-formed underlying inverter driver transistors formed in substrate 102. They also form the gates of subsequently-formed overlying thin film load transistors. For instance, referring to FIG. 1, conductor 120 eventually forms a common gate for transistors corresponding to driver transistor 16 and load transistor 18. Conductor 122 forms a common gate for transistors corresponding to driver transistor 17 and load transistor 19.

The invention also includes forming discrete conductors 124 adjacent the transistor gate conductors 120 and 122. While only one such discrete conductor 124 is shown, transistor device 100 preferably includes a split pair of discrete conductors which form memory array word or row lines, corresponding to row line 38 of FIG. 1. Discrete conductors 124 form the individual gates of transistors corresponding to access transistors 30 and 32. The active areas (not shown) of these transistors are formed in substrate 102, in regions not illustrated.

Transistor gate conductors 120 and 122 and discrete conductors 124 are similarly formed, each including planar horizontal top surfaces and vertical sidewalls. More specifically, formation of the conductors includes providing a stack over gate oxide layer 107 and coplanar field isolation region 104 consisting first of an amorphous silicon layer 130 to a thickness of about 2,500 Angstroms. Conductor formation also includes forming a thin film gate oxide layer 131 to a thickness of about 200 Angstroms. Thin film gate oxide layer 131 is formed over at least those portions of polysilicon layer 130 which will become the transistor gate conductors, and is preferably also formed over the portions of polysilicon layer 130 which will become discrete conductors 124. A nitride layer 132 is likewise applied above the transistor gate conductor and discrete conductor areas, over thin film gate oxide layer 131, to a thickness of about 1,000 Angstroms. Finally, a sacrificial oxide layer 134 is optionally applied over nitride layer 132 to a thickness of about 500 Angstroms. This stack is patterned and etched as shown so that polysilicon layer 130 forms transistor gate conductors 120 and 122 and discrete conductors 124. The sequence described above leaves gate oxide layer 131, nitride layer 132, and sacrificial oxide layer 134 overlying conductors 120, 122, and 124.

As shown, the top surfaces of the transistor gate conductors 120 and 122 are substantially coplanar. In addition, the top surfaces of discrete conductors 124 are substantially coplanar with the top surfaces of first and second transistor gate conductors 120 and 122. This elevational relationship is facilitated by the recessed nature of field isolation region 104 which allows the conductors to be fabricated on coplanar surfaces.

Figure 5:
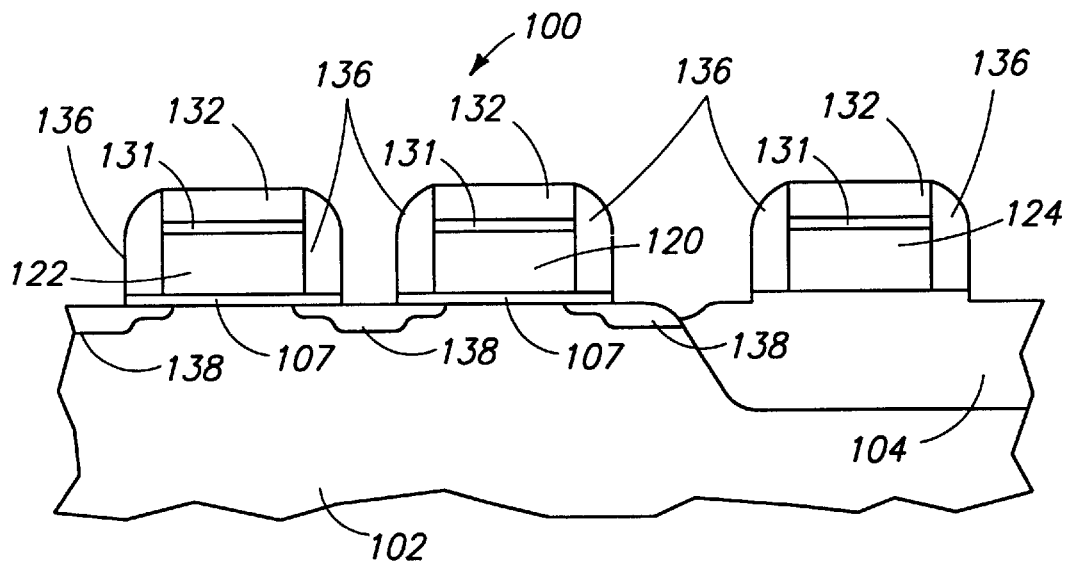
FIG. 5 is a diagrammatic section of a portion of a preferred static memory cell in accordance with the invention, shown at a processing step subsequent to that illustrated by FIG. 4.

Referring now to FIG. 5, conventional sidewall spacers 136 are formed adjacent each of transistor gate conductors 120 and 122 and discrete conductors 124 after performing light doping in desired areas of substrate 102. Sacrificial oxide layer 134 is removed by a spacer etch during formation of spacers 136. Alternatively, oxide layer 134 can be omitted, with nitride layer 132 forming a protective layer for the spacer etch. However, in such a case nitride layer 132 must be provided with a greater thickness, so that at least 700 Angstroms remains after the spacer etch.

Underlying transistor active areas 138 are implanted in the bulk semiconductor substrate 112 to create first and second driver transistors, corresponding to driver transistors 16 and 17 of FIG. 1, in the semiconductor substrate. The first and second driver transistors are gated by the first and second transistor gate conductors 120 and 122, respectively.

Figure 6:
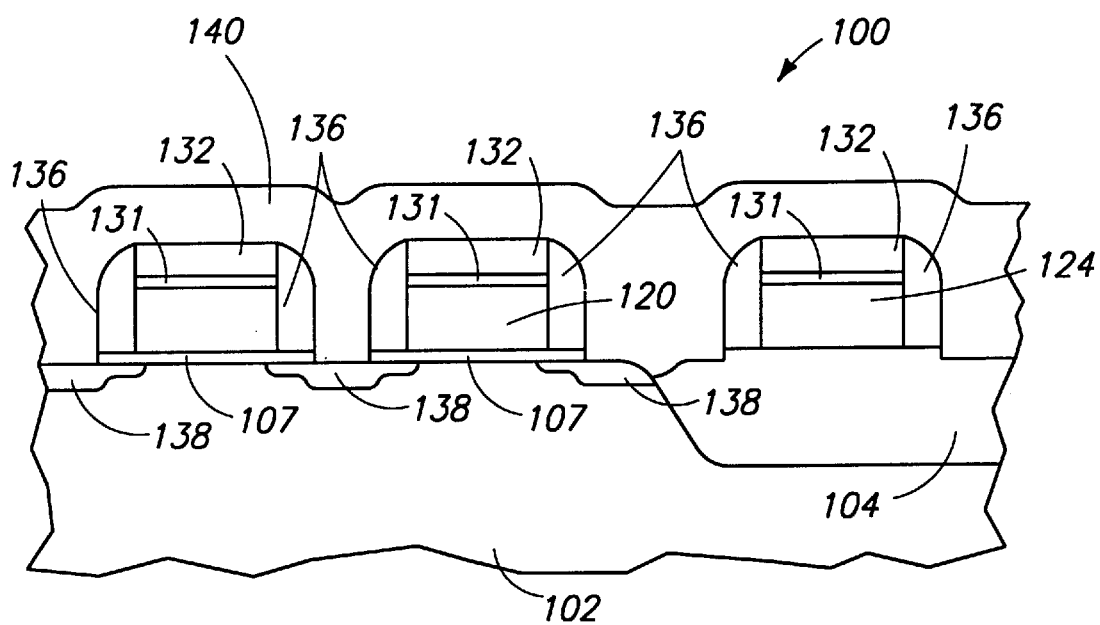
FIG. 6 is a diagrammatic section of a portion of a preferred static memory cell in accordance with the invention, shown at a processing step subsequent to that illustrated by FIG. 5.

As shown in FIG. 6, further processing steps in accordance with the invention include providing an insulating filler 140 over semiconductor substrate 102 adjacent and around transistor gate conductors 120 and 122 and discrete conductors 124. Insulating filler 140 is preferably a relatively thick deposition of triethylorthosilicate (TEOS) or borophosphosilicate glass (BPSG). The insulating filler must be deposited to a minimum elevation which is at least as high as the top surfaces of the transistor gate conductors and the discrete conductor. This typically requires a deposition thickness of approximately 5,500 Angstroms.

Figure 7:
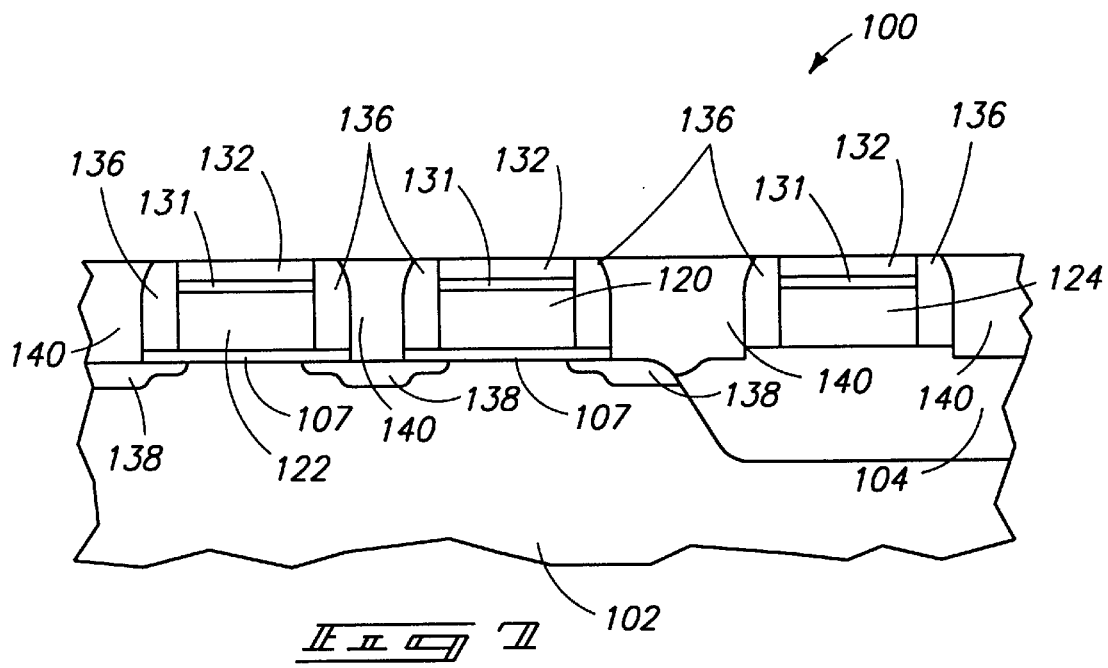
FIG. 7 is a diagrammatic section of a portion of a preferred static memory cell in accordance with the invention, shown at a processing step subsequent to that illustrated by FIG. 6.

A subsequent processing step, the results of which are shown by FIG. 7, comprises leveling insulating filler 140 to provide generally planar upper insulating surfaces adjacent the thin film transistor gate conductors 120 and 122 and the discrete conductors 124. This step is preferably accomplished by performing chemical mechanical polishing (CMP). The CMP process utilizes a slurry such as a colloidal silica which is selective to nitride layer 132 to form a planar topology which is substantially level with nitride layer 132. Nitride layer 132 thus acts as an etch stop layer during leveling of insulating filler 140.

This "leveling" or "planarizing" step results in the formation of flat or nearly flat surfaces, in which the upper surfaces of insulating filler 140 are generally planar and also substantially coplanar with the top surfaces of the transistor gate conductors 120 and 122 and discrete conductors 124. More specifically, at this point the elevation of the top surfaces of insulating filler 140 is within less than about 1000 Angstroms of the elevations of the top surfaces of gate conductors 120 and 122 and coplanar discrete conductors 124. Note that the CMP processing removes at least 500 Angstroms off nitride layer 132, leaving less than 500 Angstroms of remaining nitride over conductors 120, 122, and 124. The elevation of the surrounding oxide materials is also reduced to the resulting diminished elevation of nitride layer 132.

In addition to its function as an etch stop layer, nitride layer 132 forms an oxidation barrier over gate conductors 120 and 122 and discrete conductor 124 to protect these polysilicon conductors during any necessary oxidation steps.

Figure 8:
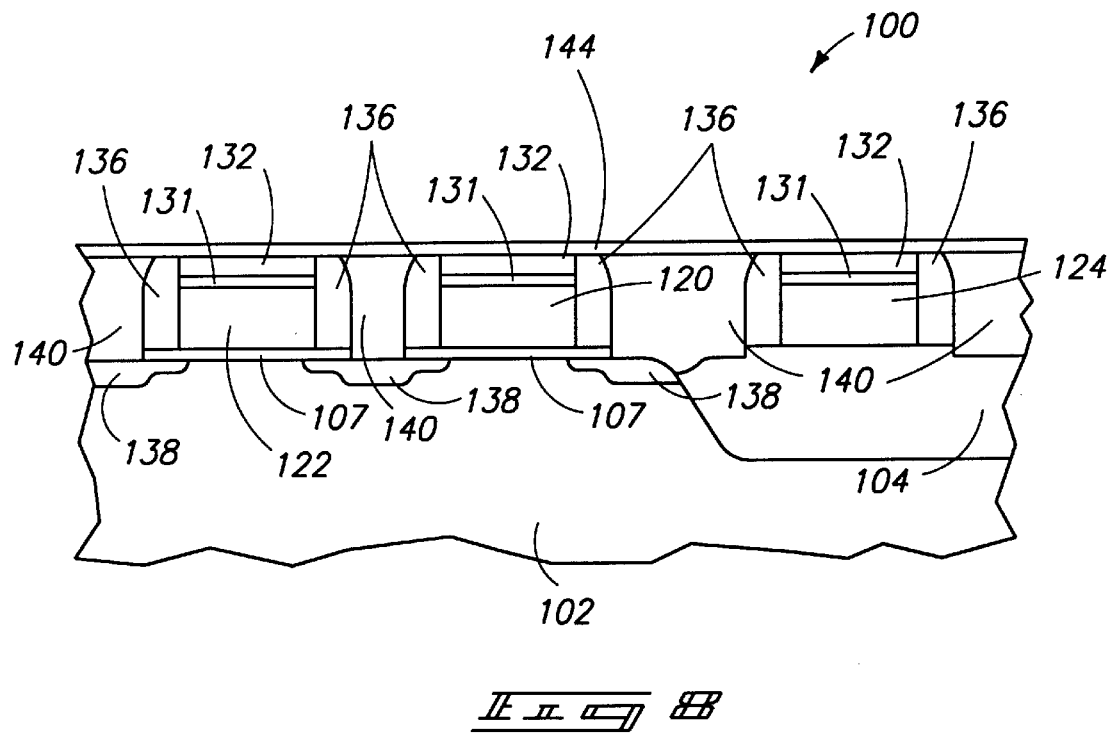
FIG. 8 is a diagrammatic section of a portion of a preferred static memory cell in accordance with the invention, shown at a processing step subsequent to that illustrated by FIG. 7.

FIG. 8 shows the application of a thin insulating oxide layer 144 over the planar surfaces resulting from the leveling step described above. Insulating oxide layer 144 has a thickness of about 300 Angstroms and is subsequently patterned and etched so that it remains over a portion of nitride layer 132 which overlies discrete conductor 124.

Referring to FIG. 9, portions of insulating oxide layer 144 overlying transistor gate conductors 120 and 122 are removed. Portions of nitride layer 132 remaining over transistor gate conductors 120 and 122 are additionally removed by using a selective wet etch such as 150° C. phosphoric acid. Insulating oxide layer 144 protects the portions of nitride layer 132 over discrete conductor 124 during this wet etch process. Removing oxide layer 144 leaves discrete surface elevation steps at the edges of gate conductors 120 and 122. The height of these steps corresponds to the thickness of nitride remaining over the conductors after CMP processing, which is preferably less than 500 Angstroms.

As shown by FIG. 10, an additional step comprises patterning exhumed contacts over portions of transistor gate conductors 120 and 122. Specifically, an exhumed contact is formed over each of transistor gate conductors 120 and 122 by removing gate oxide layer 131 from over portions of the transistor gate conductors. This allows cross-coupling between the transistor gates and the drains of the opposed thin film load transistors. In the cross-section of FIG. 10, an exhumed contact area 146 is shown over second transistor gate conductor 122. Exhumed contact area 146 is exposed by patterning photoresist (not shown) and etching with $CF_4$ and $CHF_3$. Note that this process is self-aligning, since photoresist can be patterned around the general area of the desired exhumed contact. The subsequent etching removes the gate oxide layer over transistor gate conductor 122, as well as surrounding insulating oxide which is not shielded by photoresist. The etching steps described above results in two small surface elevation steps around the exhumed contacts. Specifically, a first surface elevation step of about 700 Angstroms is left at the immediate edges of conductor 122. A second surface elevation step of about 400 Angstroms is left at the edges of photoresist patterning, in the oxide surrounding conductor 122.

The step heights resulting from the described processes are minimal, and the surfaces remain generally planar. For instance, the elevation step heights are preferably within 10% of the total depth of focus of the available lithography equipment at the required numerical aperture. More specifically, each elevation step height is preferably less than 1000 Angstroms, and more preferably no more than 700 Angstroms. This reduces difficulties in removing sidewall materials during etching, and also allows the use of smaller lithography apertures during the various processes related to subsequent thin film creation.

Figure 11:
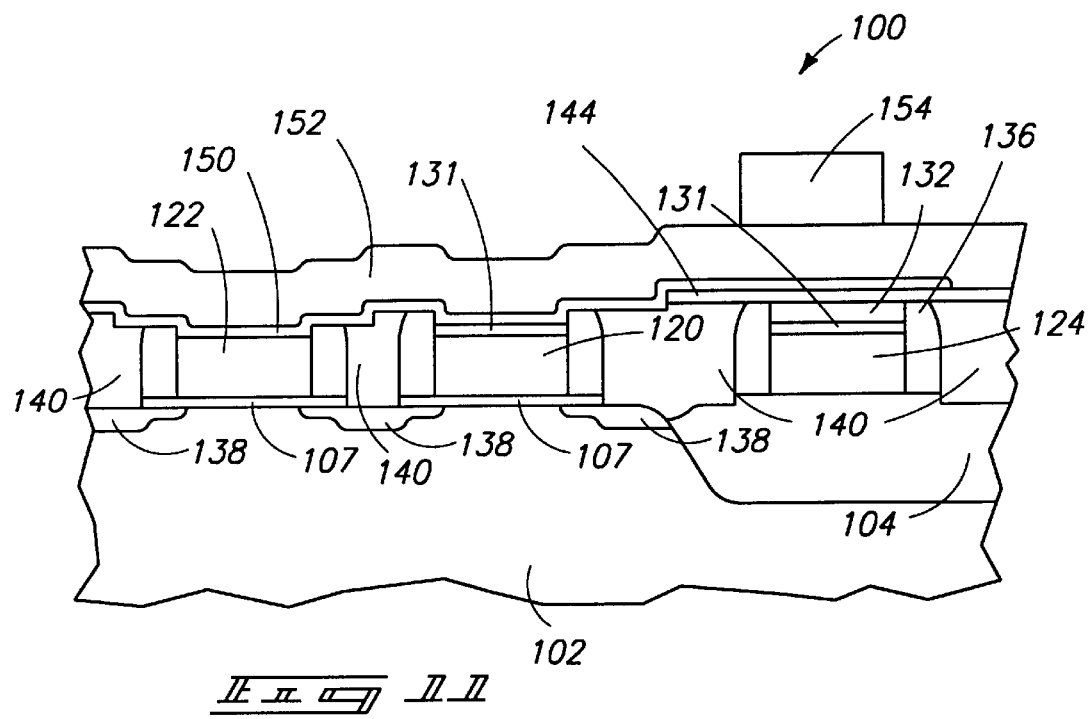
FIG. 11 is a diagrammatic section of a portion of a preferred static memory cell in accordance with the invention, shown at a processing step subsequent to that illustrated by FIG. 10.

The invention includes the further step of forming first and second planar semiconductor thin films over the first and second transistor gate conductors 120 and 122, respectively. The cross-sectional view of FIG. 11 shows the first planar semiconductor thin film, designated by the reference numeral 150. First planar semiconductor thin film 150 is a layer of polysilicon which is formed over first transistor gate 120, more specifically over the remaining gate oxide layer 131 which overlies first transistor gate 120. It extends over the planar insulating surfaces of insulating filler 140 surrounding first transistor gate 120. It also extends at least partially over coplanar discrete conductor 124. First planar semiconductor thin film 150 further extends at least partially over and into electrical contact with second transistor gate conductor 122.

First semiconductor planar thin film 150 is doped to provide channel, source, and drain regions of a first thin film load transistor corresponding to load transistor 18 of FIG. 1. More specifically, the portion of first thin film 150 which extends toward and over second transistor gate conductor 122 is doped to form a thin film drain region. The portion of first thin film 150 which extends toward and over discrete conductor 124 is doped to form a thin film source region. This first thin film load transistor is bottom gated by first transistor gate conductor 120.

Note that the drain region of thin film 150 overlaps underlying gate conductor 120. This overlap is provided to protect against the results of photoresist misalignment during thin film patterning. Such misalignment can result in damage to the silicon of gate conductor 120 when overetching is required to remove silicon from vertical surfaces. In most cases, however, the planarity of thin film 150 allows over-etching to be minimized. Accordingly, the overlap of thin film 150 will not be required in many cases.

The source region formed by thin film 150 is connected to a power supply such as $V_{cc}$, as shown by FIG. 1. The processes described leave nitride layer 132, gate oxide layer 131, and the overlying insulating oxide layer 144 over discrete conductor 124, providing electrical separation between discrete conductor 124 and $V_{cc}$. Specifically, leaving nitride layer 132, gate oxide layer 131, and the overlying insulating oxide layer 144 over discrete conductor 124 reduces any capacitive coupling between discrete conductor 124 (corresponding to a memory array word or row line) and the overlying first planar semiconductor thin film 150 (connected to $V_{cc}$).

Further processing steps are performed as needed to complete the structure and interconnecting elements of an SRAM cell. In the preferred embodiment, a thick layer of oxide 152 is deposited over thin film 150. A ground or $V_{ss}$ conductor 154, atop thick oxide layer 152, is formed to overly discrete conductor 124.

The structure described above allows formation of thin film channel, source, drain, and connecting regions which are substantially planar, having surface elevation steps which are each less than 1000 Angstroms. This allows the use of smaller lithography apertures, in turn allowing higher resolution and resulting transistor densities. The need for anti-reflective coating is largely eliminated. Furthermore, even in cases where anti-reflective coating is employed, its removal is simplified by the absence of vertical walls of such coating. Anisotropic patterning of the thin film itself is also simplified by the absence of steep vertical surfaces.

The processing sequences discussed above can be rearranged in some situations to achieve similar results. For instance, there may be cases in which there is no need for isolation between discrete conductor 124 and the overlying first planar semiconductor thin film 150, or in which oxide layer 131 and nitride layer 132 provide sufficient isolation by themselves. In such cases, insulating oxide layer 144 is omitted.

As another example of an alternative sequence of processing steps (not shown), all of nitride layer 132 is selectively removed from over conductors 120, 122, and 124 after CMP planarization. Following such nitride removal, oxide layer 131 is masked and removed from the areas where thin film source, drain, and channel regions are to be formed. A subsequent oxide deposition forms the thin film gate oxide.

In another possible sequence of processing steps, all of nitride layer 132 is selectively removed from over conductors 120, 122, and 124 after CMP planarization. Oxide layer 144 is then deposited. Oxide layers 144 and 131 are then removed during a photomasking step from over the surface of thin film regions overlying gate conductors 120 and 122 before re-depositing new gate oxide regions.

Another sequence begins by masking and removing portions of both nitride layer 132 and oxide layer 131 which overly thin film regions of gate conductors 120 and 122. Thin film gate oxide is then deposited. Nitride layer 132 and oxide layer 131 remain over discrete conductor 124. Insulating layer 144 can be omitted where the thickness of nitride layer 132 and oxide layer 131 are sufficient to provide the desired degree of electrical isolation between discrete conductor 124 and any overlying conductors.

Finally, it may be possible to skip the initial formation of oxide layer 131. While this layer acts as a protective layer during removal of overlying nitride, it may be possible in some situations to remove such nitride without damaging underlying polysilicon. If so, oxide layer 131 can be omitted, with gate oxide being deposited after removal of nitride layer portions overlying conductors 120 and 122.

Figure 12:
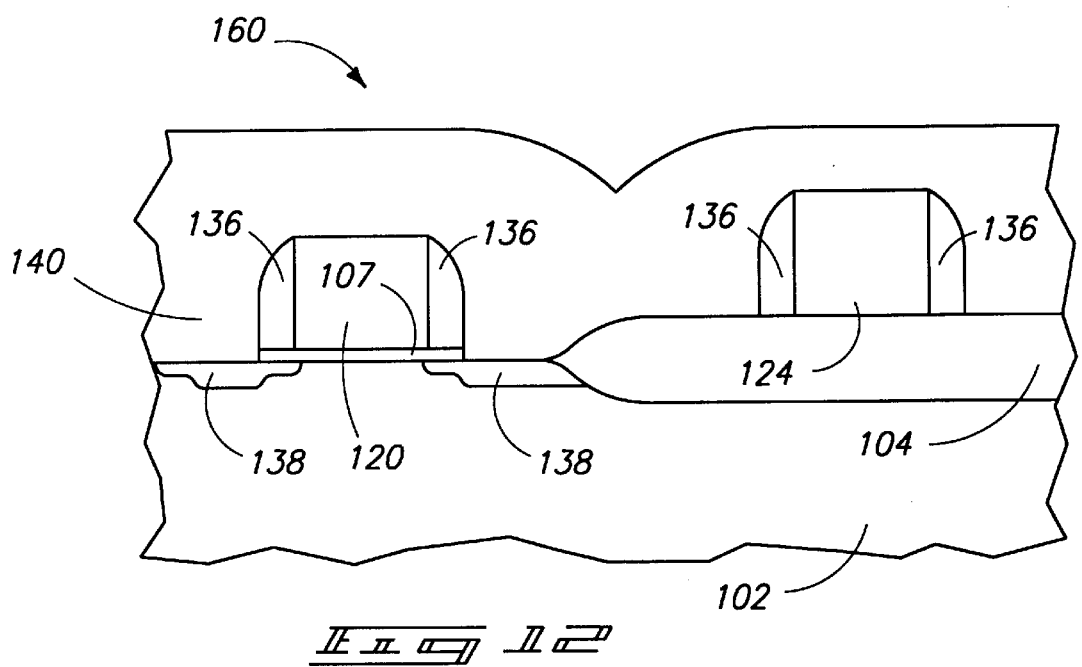
FIG. 12 is a diagrammatic section of a portion of an alternative embodiment of a static memory cell in accordance with the invention, shown at an initial processing step.

FIGS. 12–14 show a portion of an alternative embodiment of an SRAM transistor device in accordance with the invention. The alternative transistor device is generally labeled 160. The structure is similar in most respects to transistor device 100, described above, and is schematically equivalent to the circuit represented by FIG. 1. Accordingly, analogous components and regions have been identically labeled. Furthermore, formation of the second preferred embodiment proceeds in most respects as already described with reference to FIGS. 3–11. Accordingly, descriptions which would be merely duplicative of the descriptions above have been omitted. In addition, FIGS. 12–14 do not show second transistor gate conductor 122, since such illustration is unnecessary to form an understanding of the second preferred embodiment.

In the alternative embodiment shown by FIGS. 12–14, discrete conductor 124 is formed over a partially recessed field isolation region 104, in contrast to the fully recessed field isolation region of FIGS. 3–11. The upper surface of field isolation region 104 is not coplanar or level with the upper surface of the adjacent semiconductor substrate 102. Specifically, field isolation region 104 is formed with poly-buffered LOCOS or other techniques without first etching silicon substrate 102. This results in the upper surface of field isolation region 104 being above the upper surface of substrate 102.

Gate conductor 120 and discrete conductor 124, and their associated sidewall spacers 136, are formed as described above with reference to FIGS. 4 and 5, with discrete conductor 124 being elevated atop partially recessed field isolation region 104. However, because of subsequent steps, the polysilicon layer which forms the gate conductors and the discrete conductor must be much thicker than described above with regard to the first embodiment. Specifically, such a polysilicon layer is applied to an initial depth of about 5000 Angstroms.

Underlying active regions 138 are created in the underlying substrate 102 as already described. Processing steps in accordance with the invention then include providing an insulating filler 140 over semiconductor substrate 102 adjacent and around the transistor gate conductors and discrete conductors 124. As already described, insulating filler 140 is preferably a relatively thick deposition of TEOS or BPSG. The insulating filler must be deposited to a minimum elevation which is at least as high as the top surfaces of the transistor gate conductors and the discrete conductor. This typically requires a deposition thickness of approximately 5500 Angstroms.

A subsequent planarizing step, the results of which are shown by FIG. 13, comprises leveling insulating filler 140 to provide generally planar upper insulating surfaces adjacent the thin film transistor gate conductors and the discrete conductors. This step is preferably accomplished by performing chemical mechanical polishing (CMP). In this case, however, the CMP utilizes a colloidal silica slurry which etches oxide and polysilicon at the same rate. No nitride etch stop layer is utilized, and the CMP process is performed for a predetermined duration to at least the level of the upper surface of first gate conductor 120. Thus, the step of leveling comprises performing a singular chemical mechanical polishing of the insulation filler, the transistor gate conductors, and the discrete conductor to provide the insulation filler, the transistor gate conductors, and the discrete conductor with substantially coplanar upper surfaces. A significant amount of polysilicon is removed from the top of discrete conductor 124. Because of the increased initial thickness of the layer which forms this conductor, however, a sufficient thickness remains after CMP processing.

Subsequently, an optional insulating oxide layer 144 is provided, patterned, and etched (FIG. 14) similarly to the process described with reference to FIG. 8. A thin film gate oxide layer 131 is also provided, preferably by deposition of oxide by low pressure chemical vapor deposition (LPCVD). Gate oxide layer 131 is then etched (not shown) to form exhumed contacts. This results in a generally planar surface upon which thin film polysilicon is subsequently provided and implanted as already described with reference to FIG. 11. Further processing steps also proceed as indicated in the discussion relating to FIG. 11.

The methods and structures described with reference to the alternative embodiment provide advantages similar to those achieved with the methods and structures of FIGS. 3–11, allowing formation of a planar thin film which in turn allows smaller lithography apertures, higher device densities, and reduced processing.

In compliance with the statute, the invention has been described in language more or less specific as to structural and methodical features. It is to be understood, however, that the invention is not limited to the specific features described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a static random access memory cell on a semiconductor substrate, the method comprising:

forming a field isolation region over a semiconductor substrate;

forming first and second adjacent transistor gate conductors proximate the field isolation region;

forming a word line over the field isolation region;

forming an etch stop layer over the transistor gate conductors and the adjacent word line;

forming an insulating filler over the substrate to an elevation at least as high as top surfaces of the transistor gate conductors and the adjacent word line;

leveling the insulating filler, the step of leveling being selective to the etch stop layer;

removing the etch stop layer from over the transistor gate conductors and leaving the etch stop layer over the word line; and forming a semiconductor thin film over the first transistor gate conductor, over the insulating filler, and at least partially over the word line; the semiconductor thin film comprising source and drain regions of a thin film load transistor which is gated from beneath by the first transistor gate conductor; the etch stop layer being positioned between the word line and the overlying semiconductor thin film; the etch stop layer reducing capacitive coupling between the word line and the overlying semiconductor thin film during operation of the static random access memory cell.

2. The method of claim 1 further comprising forming the source and drain regions of the thin film load transistor by doping the semiconductor thin film.

3. The method of claim 1 wherein the leveling the insulating filler includes chemical mechanical polishing which is selective to the etch stop layer.

4. The method of claim 1 wherein the leveling the insulating filler includes chemical mechanical polishing which is selective to the etch stop layer, the method further comprising:

forming an insulating oxide layer over a portion of the etch stop layer which overlies the word line; and the etch stop layer and overlying insulating oxide layer being positioned between the word line and the overlying semiconductor thin film, the etch stop layer and the insulating oxide layer reducing capacitive coupling between the word line and the overlying semiconductor thin film.

5. The method of claim 1 further comprising:

forming a gate oxide layer over the transistor gate conductors and the word line;

the etch stop layer being formed over the gate oxide layer;

the insulating filler including chemical mechanical polishing which is selective to the etch stop layer;

the semiconductor thin film being formed over the gate oxide layer;

removing the gate oxide layer from over the second transistor gate conductor, the semiconductor thin film extending over and into electrical contact with the second transistor gate conductor; and leaving the gate oxide layer over the word line, the etch stop layer and the gate oxide layer being positioned between the word line and the overlying semiconductor thin film, the etch stop layer and the gate oxide layer reducing capacitive coupling between the word line and the overlying semiconductor thin film.

6. The method of claim 1 wherein the field isolation region and the semiconductor substrate have upper surfaces which are substantially coplanar.

7. The method of claim 1 wherein the semiconductor thin film is planar.

8. A method of forming a static random access memory cell on a semiconductor substrate, comprising:

forming a field isolation region on a semiconductor substrate;

forming first and second adjacent transistor gate conductors over the semiconductor substrate proximate the field isolation region, the transistor gate conductors having substantially coplanar top surfaces;

forming a memory array word line proximate one of the transistor gate conductors over the field isolation region, the word line having a top surface which is substantially coplanar with the transistor gate conductor top surfaces;

incorporating the first and second transistor gate conductors into first and second driver transistors, respectively;

forming an etch stop layer over the transistor gate conductors and the adjacent word line;

forming an insulating filler over the semiconductor substrate proximate the transistor gate conductors and the word line to an elevation at least as high as the top surfaces of the transistor gate conductors and the word line;

leveling the insulating filler with an etch selective to the etch stop layer to provide substantially planar insulating surfaces which are substantially coplanar with the top surfaces of the transistor gate conductors and the word line;

removing the etch stop layer from over the transistor gate conductors and leaving the etch stop layer over the word line;

forming a planar semiconductor thin film over the first transistor gate conductor, over the adjacent planar insulating surfaces, at least partially over the coplanar word line, and at least partially over the second transistor gate conductor;

forming source and drain regions within the planar semiconductor thin film, the source and drain regions being gated from beneath by the first transistor gate conductor and defining portions of a thin film load transistor;

the etch stop layer being positioned between the word line and the overlying planar semiconductor thin film;

the etch stop layer reducing capacitive coupling between the word line and the overlying planar semiconductor thin film during operation of the static random access memory cell.

9. The method of claim 8 wherein the leveling the insulating filler includes chemical mechanical polishing which is selective to the etch stop layer.

10. The method of claim 8 wherein the leveling the insulating filler includes chemical mechanical polishing which is selective to the etch stop layer, the method further comprising:

providing an insulating oxide layer over a portion of the etch stop layer which overlies the word line;

the etch stop layer and overlying insulating oxide layer being positioned between the word line and the overlying planar semiconductor thin film, the etch stop layer and the insulating oxide layer reducing capacitive coupling between the word line and the overlying planar semiconductor thin film during operation of the static random access memory cell.

11. The method of claim 8 further comprising:

providing a gate oxide layer over the transistor gate conductors and the word line;

the etch stop layer being applied over the gate oxide layer;

the step of leveling the insulating filler including chemical mechanical polishing which is selective to the etch stop layer;

the planar semiconductor thin film being formed over the gate oxide layer;

removing the gate oxide layer from over the second transistor gate conductor, the planar semiconductor thin film extending over and into electrical contact with the second transistor gate conductor; and leaving the gate oxide layer over the word line, the etch stop layer and the gate oxide layer being positioned between the word line and the overlying planar semiconductor thin film, the etch stop layer and the gate oxide layer reducing capacitive coupling between the word line and the overlying planar semiconductor thin film during operation of the static random access memory cell.

12. The method of claim 8 wherein the field isolation region and the semiconductor substrate have upper surfaces which are substantially coplanar.

* * * * *

UNITED STATES PATENT AND TRADEMARK OFFICE
CERTIFICATE OF CORRECTION

PATENT NO : 6,049,093
DATED : April 11, 2000
INVENTOR(S) : H. Montgomery Manning et al.

It is certified that error appears in the above-identified patent and that said Letters Patent are hereby corrected as shown below:

Col. 3, line 5
  replace "A as portion" with --A portion--.

Signed and Sealed this

Twenty-fourth Day of April, 2001

NICHOLAS P. GODICI

Attest:

Attesting Officer        Acting Director of the United States Patent and Trademark Office

UNITED STATES PATENT AND TRADEMARK OFFICE
CERTIFICATE OF CORRECTION

PATENT NO. : 6,049,093
DATED : April 11, 2000
INVENTOR(S) : H. Montgomery Manning et al.

Page 1 of 1

It is certified that error appears in the above-identified patent and that said Letters Patent is hereby corrected as shown below:

Column 1,
Line 4, add the following:

-- GOVERNMENT RIGHTS

This invention was made with the United States Government support under contract No.: MDA972-92-C-0054 awarded by the Advanced Research Projects Agency (ARPA). The United States Government has certain fights in this invention. --

Signed and Sealed this

Twenty-third Day of April, 2002

*Attest:*

*Attesting Officer*

JAMES E. ROGAN
*Director of the United States Patent and Trademark Office*